United States Patent [19]
Lin

[11] Patent Number: 5,955,763
[45] Date of Patent: Sep. 21, 1999

[54] LOW NOISE, HIGH CURRENT-DRIVE MOSFET STRUCTURE FOR UNIFORM SERPENTINE-SHAPED POLY-GATE TURN-ON DURING AN ESD EVENT

[75] Inventor: Shi-Tron Lin, Taipei, Taiwan

[73] Assignee: Winbond Electronics Corp., Taiwan

[21] Appl. No.: 08/931,343

[22] Filed: Sep. 16, 1997

[51] Int. Cl.⁶ .................................................. H01L 23/62
[52] U.S. Cl. ........................ 257/355; 257/365; 257/401
[58] Field of Search .................................. 257/365, 270, 257/355–364, 401

[56] References Cited

U.S. PATENT DOCUMENTS

| | | |
|---|---|---|
| 4,638,187 | 1/1987 | Boler et al. . |
| 4,725,747 | 2/1988 | Stein et al. . |
| 4,847,212 | 7/1989 | Balzan et al. ............................ 438/234 |
| 4,949,139 | 8/1990 | Korsh et al. . |
| 5,252,842 | 10/1993 | Buck et al. .............................. 257/192 |
| 5,258,638 | 11/1993 | Elhatem et al. ......................... 257/401 |
| 5,477,407 | 12/1995 | Kobayashi et al. ...................... 257/355 |
| 5,490,095 | 2/1996 | Shimada et al. ......................... 364/578 |
| 5,563,439 | 10/1996 | Chung et al. ............................ 257/365 |
| 5,672,894 | 9/1997 | Maeda et al. ............................ 257/343 |

OTHER PUBLICATIONS

A. Amerasekera, C. Duvvury, "ESD In Silicon Integrated Circuits," Chap. 3.5.2 & 4.3.2 (1995).

*Primary Examiner*—David B. Hardy
*Attorney, Agent, or Firm*—Proskauer Rose LLP

[57] ABSTRACT

A multi-gate-finger MOSFET structure positions the gate element over a channel between drain and source diffusion regions, such that the entire structure is within the active region in a substrate. The gate/channel-to-drain and gate/channel-to-source diffusion edges are continuous along the gate/channel layout, so as to cascade the snap-back action to enhance uniform turn on of the entire gate element during an ESD event. In addition, the gate signal RC delay is sufficient to provide noise suppression of the output voltage when the MOSFET is used as a high current-drive CMOS output buffer.

35 Claims, 3 Drawing Sheets

LOW NOISE, HIGH CURRENT-DRIVE MOSFET STRUCTURE FOR UNIFORM SERPENTINE-SHAPED POLY-GATE TURN-ON DURING AN ESD EVENT

RELATED APPLICATION

This invention is related to U.S. patent application Ser. No. 08/931,343, entitled "A High-Speed MOSFET Structure for ESD Protection", and U.S. patent application Ser. No. 08/931,594, entitled "A Distributed MOSFET Structure with Enclosed Gate for Improved Transistor Size/Layout Area Ratio and Uniform ESD Triggering", filed on even date herewith for Shi-Tron Lin. The contents of the above-noted applications are incorporated herein by reference.

FIELD OF THE INVENTION

The present invention relates to a MOSFET structure for use in low noise, high current applications. More specifically, the present invention relates to a multi-gate-finger MOSFET structure which enhances uniform turn-on during an ESD event.

BACKGROUND OF THE INVENTION

An NMOSFET is a very effective ESD protection device. In one application, it is used as the pull down transistor of a CMOS buffer to drive an output voltage for an external device. In this type of application, the gate of the NMOSFET is connected to an input drive signal.

In another common NMOSFET application, the gate is electrically connected to ground, and the NMOSFET is used as an ESD protection device for an input pin or a power bus during an ESD event.

The ESD protective action of an NMOSFET is based on the device's snap-back mechanism, which enables the NMOSFET to conduct a high level of ESD current between its drain and source. This occurs when a strong electric field across the depletion region in the drain substrate junction becomes high enough to begin avalanche breakdown, which in turn causes impact ionization, resulting in the generation of both minority and majority carriers. The minority carriers flow toward the drain contact, and the majority carriers flow toward the substrate/p-well contact, causing a local potential build up across the current path in the p-well substrate. When the local substrate potential is 0.6V higher than an adjacent n+ source potential, the source junction becomes forward biased. The forward biased source junction then injects minority carriers (electrons) into the p-well, and these carriers eventually reach the drain junction to further enhance the impact ionization effect (see "ESD in Silicon Integrated Circuits," by A. Amerasekera and C. Duvvury, Chap. 3, Sec. 1., John Wiley & Sons, 1995). Eventually, the NMOSFET reaches a low impedance (snap-back) state, which enables it to conduct a large amount of ESD current.

When a multi-gate-finger MOSFET is used as a high current-drive output buffer, output overshoot noise spikes are frequently generated by the switching action of the CMOS output stage. Various prior art techniques have been developed to suppress this type of noise in high current-drive CMOS output buffers (see U.S. Pat. Nos. 4,949,139, by Korsh et al; 4,638,187, by Boler et al; and 4,725,747, by Stein et al). Typically, the prior art has involved multi-gate-finger MOSFET structures, with poly-gate fingers serially connected, or with resistors connected between the poly-gate fingers, to increase the gate signal RC delay. Because of this gate signal delay, the individual MOSFETs associated with each poly-gate finger are turned on (or off) sequentially, and the output signal overshoot, or spiking, is reduced through time distribution. On the other hand, this type of multi-gate-finger MOSFET structure has a distinct disadvantage with respect to ESD protection, since only a portion of the total number of gate fingers may turn on during an ESD event. As a result, the size of the CMOS buffer is effectively reduced during an ESD event, and the ESD performance is proportionately degraded.

For example, in a typical multi-gate-finger NMOS structure, as shown in FIGS. 2a and 2b, the poly gate fingers may not all turn on during an ESD event, even though they are all commonly connected to a metal bus. That is, if the first few gate fingers reach their snap-back low impedance mode before the remaining fingers, the drain terminal to source terminal voltage is reduced to a value, called the snap-back voltage, which is less than the trigger voltage of the NMOS device. This has the effect of preventing the remaining gate fingers from being turned on. As a result, only a partial number of the gate fingers are available to absorb the ESD energy. Therefore, the ESD protection provided by the NMOSFET is significantly reduced.

When a MOSFET gate finger is triggered during an ESD event, the entire finger turns on.

This is due to the previously described cascading effect of the impact ionization and snap-back process along the entire gate finger. Moreover, experimental data indicates that a long-gate-finger structure (e.g. 100 um×2), as shown in FIG. 3, has better ESD performance than a short-gate-finger structure (e.g. 20 um×10), of the type shown in FIG. 2a, where both structures have the same total gate width of 200 um. That is, during an ESD event, the long-finger NMOSFET structure will have either one or two gate fingers (50% to 100% of total gate width) turned on, while the short-finger NMOSFET may only have a few fingers (out of 10) turned on, with each finger being only 10% of the total gate width. In addition, the RC delay associated with a long gate finger is very effective in suppressing overshoot noise in a high current-drive buffer application. For manufacturing purposes, however, layout area is typically at a premium, and a conventional long-finger structure may not fit into the designated layout area. Therefore, both multi-gate-finger (short) and long-gate-finger (long) types of structures are used, depending on physical and electrical priorities.

A commonly used multi-gate-finger structure is shown in FIG. 4, where the poly-gate fingers are connected by a poly-gate bus, rather than the metal bus of FIG. 2a.

One prior art technique for improving the uniform turn on of such a multi-gate-finger NMOSFET structure uses a gate coupled technique, as shown in FIG. 5, and as described in "ESD in Silicon Integrated Circuits," by A. Amerasekera and C. Duvvury, Chap. 4, Sec. 2., John Wiley & Sons, 1995. In this configuration, the drain is connected to either VDD or the buffer output line, and the gate is coupled to the drain via a capacitor C, and is also connected to ground via a resistor R. The coupling capacitor C and the RC time constant of the circuit cause the gate potential to rise to 1 to 2v during the first 5 to 10 ns of an ESD event. The positive gate voltage reduces the triggering threshold of the NMOSFET, thereby enabling a more uniform turn-on of the gate fingers. This method, however, has the disadvantage of requiring additional layout area for the coupling capacitor and the resistor. In addition, since the gate is connected to ground through a resistor R, this configuration is not particularly well suited for an output buffer application.

Another type of prior art multi-gate-finger structure, as described in U.S. Pat. Nos. 4,725,747 and 4,949,139, uses the gate resistance in combination with the MOSFET RC delay to sequentially cause the MOSFET gate fingers to be turned on or off. This sequential turn on/turn off technique suppresses the noise spikes in a high current-drive output buffer through time distribution. FIG. 6 shows this type of prior art configuration, where the poly-gate fingers are serially connected into a serpentine-like gate structure in order to increase the gate signal RC delay.

With respect to ESD uniform turn on, however, this prior art serpentine gate structure is essentially equivalent to a conventional multi-gate-finger structure (FIG. 4), since each gate finger extends beyond the diffusion area and into the field oxide region. Therefore, as described above, this configuration does not provide optimum ESD protection because of its non-uniform turn on characteristics, in that only a partial number of gate fingers may turn on during an ESD event.

Accordingly, it is an object of the present invention to overcome the disadvantages of the prior art with respect to MOSFET ESD protection. It is a further object of the present invention to retain the desirable noise suppression attributes of the multi-gate-finger structure, while at the same time providing an inventive improvement in MOSFET ESD performance.

SUMMARY OF THE INVENTION

In accordance with an illustrative embodiment of the present invention, a multi-gate-finger MOSFET structure is configured to enhance uniform turn on during an ESD event. This is achieved by positioning the active portion of a serpentine-like poly-gate element, overlying a serpentine-like channel layout, between drain and source regions configured in a comb-shaped structure. Importantly, the channel, active gate portion, drain, and source elements are completely contained within an active diffusion area, such that the channel-to-drain and channel-to-source diffusion edges are continuous throughout the length of the active gate portion overlying the channel. This enables a cascading snap-back action to develop very rapidly along the active portion of the gate element during the occurrence of an ESD event, thus enhancing the desired uniform turn on of all the MOSFET devices within the diffusion area.

In another illustrative embodiment of the present invention, a longitudinal MOSFET structure is configured with a U-shaped gate element overlying a channel positioned between corresponding drain and source regions in an active diffusion region. As in the first embodiment, the channel-to-drain and channel-to-source diffusion edges are continuous throughout the length of the active portion of the gate body overlying the channel, and are completely contained within an active diffusion region. Again, the cascading snap-back action develops very rapidly along the active portion of the gate element during the occurrence of an ESD event, thus enhancing the desired uniform turn on of all the MOSFET devices within the diffusion area.

Alternatively, when the MOSFET is used as a high current-drive output buffer, both the serpentine-like and the U-shaped gates, in conjunction with their respective MOSFET RC delays, provide suppression of the noise signals typically generated by the switching action of the output stage.

These embodiments are more fully described below in conjunction with the following drawings.

BRIEF DESCRIPTION OF THE DRAWINGS

FIG. 2b is a schematic representation of the structure of FIG. 2a.

DETAILED DESCRIPTION OF THE PREFERRED EMBODIMENT

Figure 1:
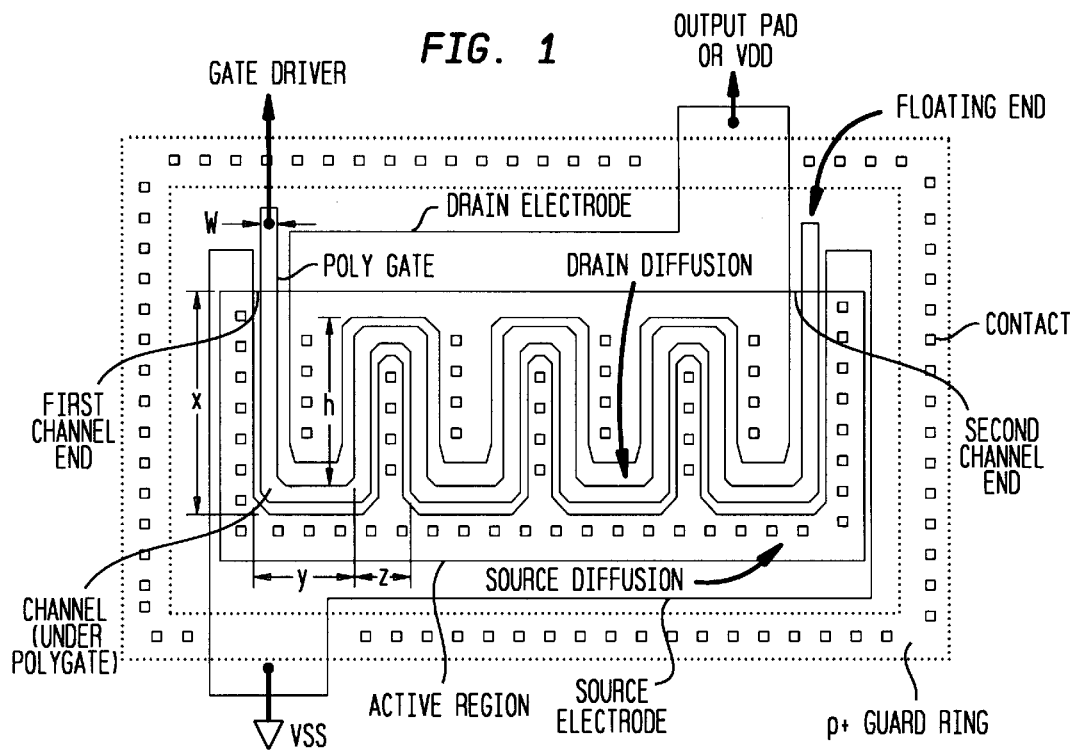
FIG. 1 depicts a first embodiment of the present invention.
Figure 2A:
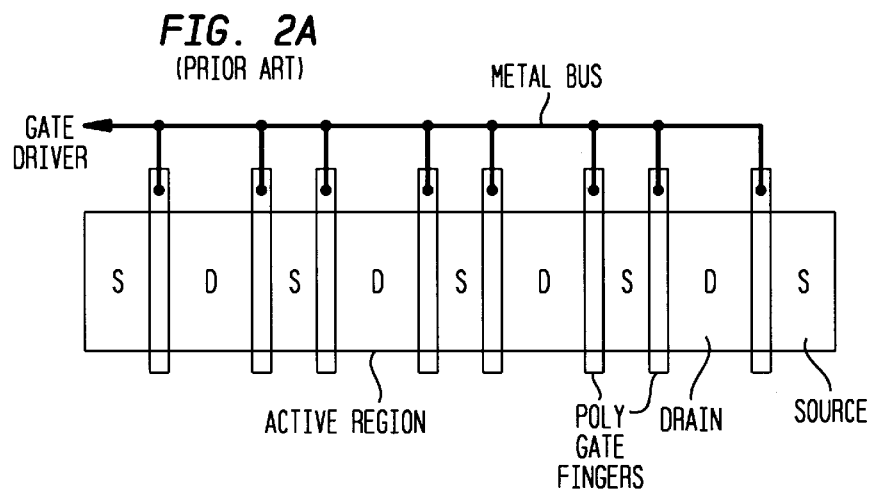
FIG. 2a shows a basic multi-gate-finger NMOS structure.
Figure 2B:
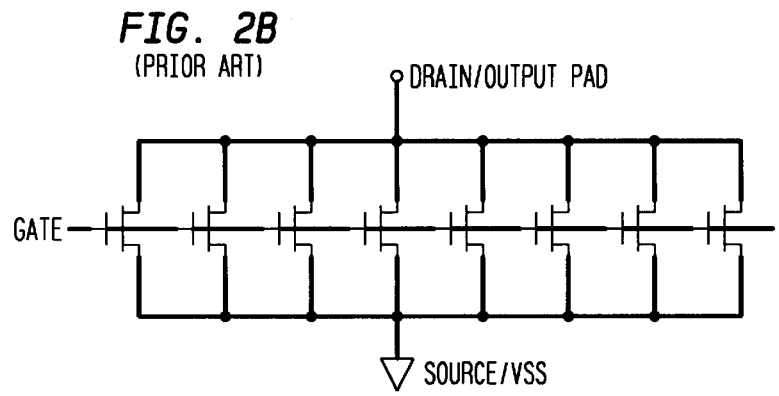
Figure 4:
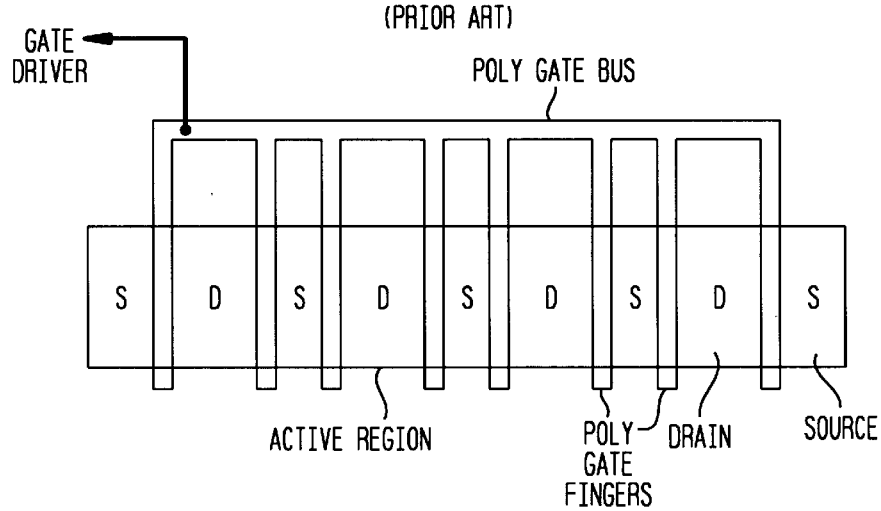
FIG. 4 depicts a conventional multi-gate-finger NMOS structure.
Figure 5:
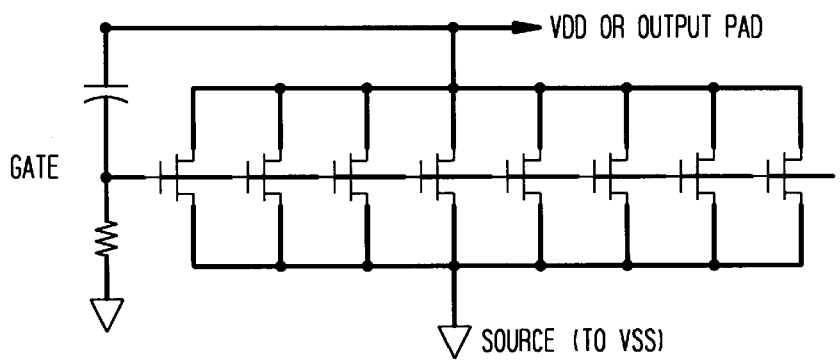
FIG. 5 is a schematic representation of a gate coupled MOSFET.
Figure 6:
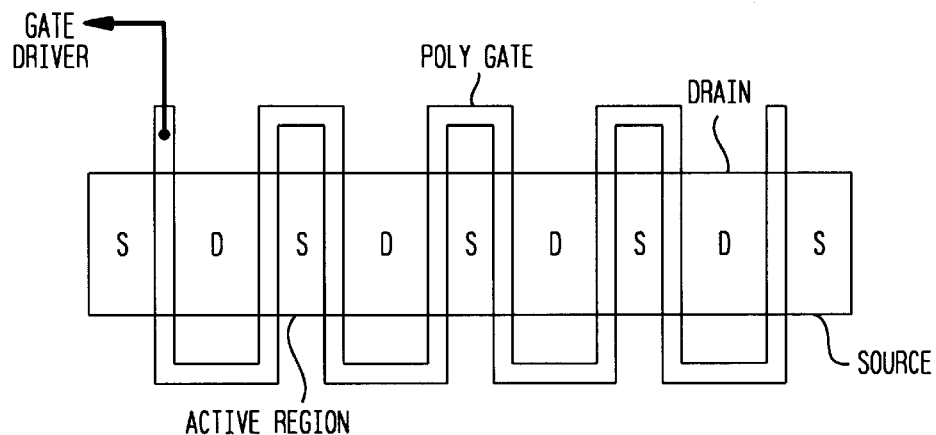
FIG. 6 shows a prior art serpentine gate configuration.
Figure 7:
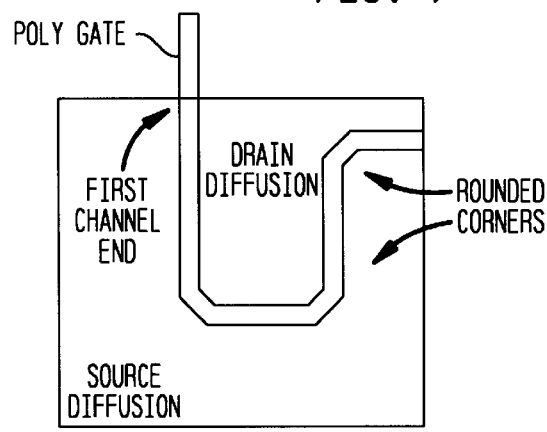
FIG. 7 provides a detail of FIG. 1.

A first embodiment of the present invention uses a serpentine gate configuration, as depicted in FIG. 1. Unlike the prior art serpentine gate structure (FIG. 6), which divides the diffusion regions into multiple source and drain segments, as represented by FIG. 4, the present invention contains the serpentine channel and overlying active gate portion (between first and second channel ends) entirely within the active region, as depicted in FIG. 1. As a result, not only are the drain and source regions interdigitated, but the drain and source diffusion regions are also interdigitated in a comb-shaped structure. Thus, the continuous serpentine channel within the active region provides a continuous channel-to-source diffusion edge and a continuous channel-to-drain diffusion edge throughout the active region. In addition, FIG. 1 also shows a gate body having rounded corners, as detailed in FIG. 7, which are used to prevent an electric field "crowding" effect.

The continuous channel-to-source and channel-to-drain diffusion edges enable the local snap-back action to cascade very rapidly along the active gate portion overlying the channel, thereby enhancing the uniform turn on of the entire gate structure during an ESD event. Moreover, the long (serpentine) gate-signal RC delay is sufficient to suppress the overshoot noise of the output voltage in a high current-drive output buffer application. Therefore, the inventive NMOSFET may also be used as the pull-down device of a low-noise, high-current CMOS driver. In this application, the poly-gate would be electrically connected to a gate-drive signal, and the drain would be electrically connected to an output pad.

Referring again to an illustrative ESD application of the present invention, the NMOSFET would be configured as a normally-off ESD protection device. The gate and source would be electrically connected to ground, while the drain would be electrically connected to an input pin or to the VDD power bus for protection during an ESD event. As described above, the inventive channel and overlying gate configuration (contained entirely within the active region) provides a rapid snap-back cascading effect along the entire gate body, which enhances the uniform turn on of all the fingers in the NMOSFET, so that the full gate width may be available to pass ESD current, thus improving the effectiveness of the NMOSFET for ESD protection.

According to one exemplary embodiment, the layout dimensions of the structure shown in FIG. 1 are as follows:

x=16 um,
y=10 um,
z=2 um, and
h=12 um.

The gate finger width w, which is approximately equal to the channel length, is 0.5 um, and the contact size is 0.5 um square. The drain contact to gate edge spacing is 4.5 um, while the source contact to gate edge spacing is 1 um. This type of structure can be iterated to achieve a total gate/channel width of 160 to 500 um.

Figure 3:
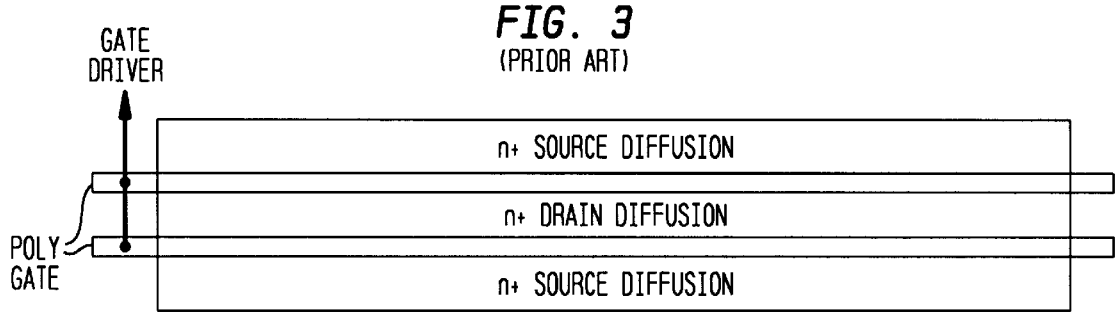
FIG. 3 shows a basic long-gate finger structure.
Figure 8:
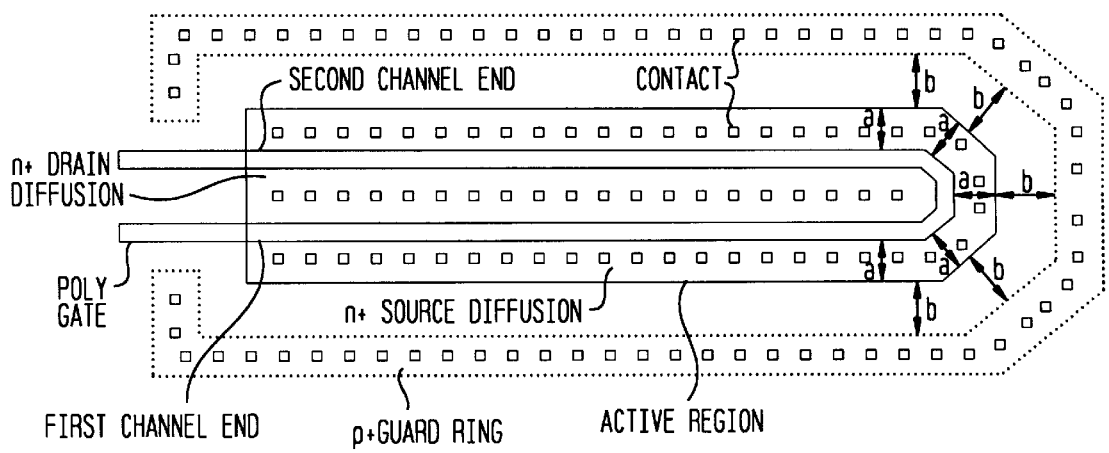
FIG. 8 depicts a second embodiment of the present invention.

A second embodiment of the present invention uses a long-gate-finger structure, as shown in FIG. 8. This type of configuration, while basically similar to the structure previously described in relation to FIG. 3, offers a further improvement in poly-gate turn on characteristics during an ESD event. In the inventive design of FIG. 8, the long poly-gates, overlying a U-shaped channel, are connected at the rounded end, and are entirely contained within the diffusion region. The outer edges of the n+ source diffusion region and the p+ guard-ring edges are all rounded symmetrically around the connected end of the poly-gate, as shown by dimensions a and b in FIG. 8. That is, the poly-gate/channel to outer source diffusion edge dimensions (a), as well as the outer source diffusion edge to p+ guard ring dimensions (b), are maintained approximately constant around the connected poly-gate/channel end. This symmetrical layout configuration is particularly effective for further improving the uniform turn on action of an entire dual poly-gate element during an ESD event.

In short, an inventive MOSFET structure is disclosed with improved turn on characteristics during an ESD event. Moreover, the disclosed structure also possesses noise suppression characteristics desirable for output buffer applications.

The above described embodiments of the invention are intended to be illustrative only. Numerous alternative embodiments may be devised by those skilled in the art without departing from the spirit and scope of the following claims.

What is claimed is:

1. A MOSFET structure for enhancing uniform poly-gate turn-on during a power bus-to-bus ESD event, comprising:
   an active region in a substrate,
   a channel formed in said substrate having first and second ends in the channel width direction and a serpentine shaped layout between said first and second ends,
   continuous drain and source diffusion regions within said active region, said drain and source diffusion regions being interdigitated, and being separated by said serpentine channel, such that an edge between said serpentine channel and said drain diffusion, and an edge between said serpentine channel and said source diffusion, are continuous between said first and second ends, and
   a continuous poly-gate hang rounded corners in said active region to prevent an electric field crowding effect, including a serpentine poly-gate active portion interposed between said source and drain diffusion regions, and covering said continuous serpentine channel between said first and second ends.

2. The MOSFET structure of claim 1 wherein said poly-gate is electrically connected to a gate-drive signal and the drain of said MOSFET is connected to a bond pad.

3. The MOSFET structure of claim 1 wherein said MOSFET is an NMOSFET and said poly-gate and said source are electrically connected to ground.

4. The MOSFET structure of claim 3 wherein said drain is electrically connected to a bond pad.

5. The MOSFET structure of claim 3 wherein said drain is electrically connected to a VDD bus.

6. The MOSFET structure of claim 1 wherein said MOSFET is a PMOSFET and said poly-gate and said source are electrically connected to a VDD bus.

7. The MOSFET structure of claim 1 wherein said continuous diffusion edges within said active region cascade a snap-back mode along said active portion of said poly-gate element, such that the entire said active portion of said poly-gate element turns on during an ESD event.

8. The MOSFET structure of claim 1 wherein said poly-gate element, in association with inherent RC delays, causes suppression of noise signals when said MOSFET is used as a high current-drive output buffer.

9. A MOSFET structure for enhancing uniform poly-gate turn-on during an ESD event, comprising:
   an active region in a substrate,
   a channel formed in said substrate having first and second ends in the channel width direction and a serpentine shaped layout between said first and second ends,
   continuous drain and source diffusion regions within said active region, said drain and source diffusion regions being interdigitated, and being separated by said serpentine channel, such that an edge between said serpentine channel and said drain diffusion, and an edge between said serpentine channel and said source diffusion, are continuous between said first and second ends, and
   a continuous poly-gate having rounded corners in said active region to prevent an electric field crowding effect, including a serpentine poly-gate active portion interposed between said source and drain diffusion regions, and covering said continuous serpentine channel between said first and second ends, wherein said poly-gate is electrical connected to ground through a resistor and electrically coupled to said drain through a capacitor.

10. A MOSFET structure for enhancing uniform poly-gate turn-on during a power bus-to-bus ESD event, comprising:
    an active reason in a substrate,
    a channel formed in said substrate having first and second ends in the channel width direction and a U-shaped layout between said first and second ends,
    continuous drain and source diffusion regions within said active region, said drain and source diffusion regions being separated by said U-shaped channel, such that an edge between said U-shaped channel and said drain diffusion, and an edge between said U-shaped channel and said source diffusion, are continuous between said first and second ends, and
    a continuous poly-gate having rounded corners in said active region to prevent an electric field crowding effect, including a U-shaped poly-gate active portion interposed between said source and drain diffusion regions, and covering said continuous U-shaped channel between said first and second ends.

11. The MOSFET structure of claim 10 wherein said poly-gate is electrically connected to a gate-drive signal and the drain of said MOSFET is connected to a bond pad.

12. The MOSFET structure of claim 10 wherein said MOSFET is an NMOSFET and said poly-gate and said source are electrically connected to ground.

13. The MOSFET structure of claim 12 wherein said drain is electrically connected to a bond pad.

14. The MOSFET structure of claim 12 wherein said drain is electrically connected to a VDD bus.

15. The MOSFET structure of claim 10 wherein said MOSFET is a PMOSFET and said poly-gate and said source are electrically connected to a VDD bus.

16. The MOSFET structure of claim 10 wherein said diffusion edges within said active region cascade a snap-back mode along said poly-gate element, such that the entire said poly-gate element may be turned on during an ESD event.

17. The MOSFET structure of claim 10 wherein said poly-gate element, in association with inherent RC delays, causes suppression of noise signals when said MOSFET is used as a high current-drive output buffer.

18. A MOSFET structure for enhancing uniform poly-gate turn-on, comprising:
an active region in a substrate,
a channel formed in said substrate having first and second ends in the channel width direction and a U-shaped layout between said first and second ends,
continuous drain and source diffusion regions within said active region, said drain and source diffusion regions being separated by said U-shaped channel, such that an edge between said U-shaped channel and said drain diffusion, and an edge between said U-shaped channel and said source diffusion, are continuous between said first and second ends, and
a continuous poly-gate having rounded corners in said active region to prevent an electric field crowding effect, including a U-shaped poly-gate active portion interposed between said source and drain diffusion regions, and covering said continuous U-shaped channel between said first and second ends, wherein said poly-gate is electrical connected to ground through a resistor and electrically coupled to said drain through a capacitor.

19. A MOSFET structure for enhancing uniform poly-gate turn-on, comprising:
an active region in a substrate,
a channel formed in said substrate having first and second ends in the channel width direction and a U-shaped layout between said first and second ends,
continuous drain and source diffusion regions within said active region, said drain and source diffusion regions being separated by said U-shaped channel, such that an edge between said U-shaped channel and said drain diffusion, and an edge between said U-shaped channel and said source diffusion, are continuous between said first and second ends, and
a continuous poly-gate, including a U-shaped poly-gate active portion, interposed between said source and drain diffusion regions, that is rounded symmetrically with respect to its adjacent diffusion regions, and covering said continuous U-shaped channel between said first and second ends.

20. A MOSFET structure for enhancing uniform poly-gate turn-on during a power bus-to-bus ESD event, comprising:
an active region in a substrate,
a channel formed in said substrate having first and second ends in the channel width direction and a serpentine shaped layout between said first and second ends,
continuous drain and source diffusion regions within said active region, said drain and source diffusion regions being interdigitated, and being separated by said serpentine channel, such that an edge between said serpentine channel and said drain diffusion, and an edge between said serpentine channel and said source diffusion, are continuous between said first and second ends, and
a continuous poly-gate, including a serpentine poly-gate active portion interposed between said source and drain diffusion regions, and covering said continuous serpentine channel between said first and second ends,
wherein the continuous diffusion edges within said active region cascade a snap-back mode along said active portion of said poly-gate element, such that the entire said active portion of said poly-gate element turns on during an ESD event.

21. The MOSFET structure of claim 20 wherein said MOSFET is an NMOSFET and said poly-gate and said source are electrically connected to ground.

22. The MOSFET structure of claim 21 wherein said poly-gate is electrically connected to a gate-drive signal and the drain of said MOSFET is connected to a bond pad.

23. The MOSFET structure of claim 21 wherein said drain is electrically connected to a bond pad.

24. The MOSFET structure of claim 21 wherein said drain is electrically connected to a VDD bus.

25. The MOSFET structure of claim 20 wherein said MOSFET is a PMOSFET and said poly-gate and said source are electrically connected to a VDD bus.

26. The MOSFET structure of claim 25 wherein said poly-gate element, in association with inherent RC delays, causes suppression of noise signals when said MOSFET is used as a high current-drive output buffer.

27. A MOSFET structure for enhancing uniform poly-gate turn-on during an ESD event, comprising:
an active region in a substrate,
a channel formed in said substrate having first and second ends in the channel width direction and a serpentine shaped layout between said first and second ends,
continuous drain and source diffusion regions within said active region, said drain and source diffusion regions be interdigitated, and being separated by said serpentine channel, such that an edge between said serpentine channel and said drain diffusion, and an edge between said serpentine channel and said source diffusion, are continuous between said first and second ends, and
a continuous poly-gate, including a serpentine poly-gate active portion interposed between said source and drain diffusion regions, and covering said continuous serpentine channel between said first and second ends,
wherein the continuous diffusion edges within said active region cascade a snap-back mode along said active portion of said poly-gate element, such that the entire said active portion of said poly-gate element turns on during an ESD event.

28. An output MOSFET for enhancing uniform poly-gate turn-on during an ESD event, comprising:
an active region in a substrate,
a channel formed in said substrate having first and second ends in the channel width direction and a serpentine shaped layout between said first and second ends,
continuous drain and source diffusion regions within said active region, said drain and source diffusion regions being interdigitated, and being separated by said serpentine channel, such that an edge between said serpentine channel and said drain diffusion, and an edge between said serpentine channel and said source diffusion, are continuous between said first and second ends, and
a continuous poly-gate having rounded corners in said active region to prevent an electric field crowding effect, including a serpentine poly-gate active portion interposed between said source and drain diffusion regions, and covering said continuous serpentine channel between said first and second ends.

29. The output MOSFET of claim 28, wherein said output MOSFET being part of one of an output and Input/Output pin circuit.

30. An output MOSFET structure for enhancing uniform poly-gate turn-on, comprising:

an active region in a substrate, a channel formed in said substrate having first and second ends in the channel width direction and a U-shaped layout between said first and second ends, continuous drain and source diffusion regions within said active region, said drain and source diffusion regions being separated by said U-shaped channel, such that an edge between said U-shaped channel and said drain diffusion, and an edge between said U-shaped channel and said source diffusion, are continuous between said first and second ends, and a continuous poly-gate having rounded corners in said active region to prevent an electric field crowding effect, including a U-shaped poly-gate active portion interposed between said source and drain diffusion regions, and covering said continuous U-shaped channel between said first and second ends.

31. The output MOSFET of claim 30, wherein said output MOSFET being part of one of an output and Input/Output pin circuit.

32. A MOSFET structure connected to an output transistor of one of an output and Input/Output pin circuit for enhancing uniform poly-gate turn-on during an ESD event, comprising:

an active region in a substrate, a channel formed in said substrate having first and second ends in the channel width direction and a serpentine shaped layout between said first and second ends, continuous drain and source diffusion regions within said active region, said drain and source diffusion regions being interdigitated, and being separated by said serpentine channel, such that an edge between said serpentine channel and said drain diffusion, and an edge between said serpentine channel and said source diffusion, are continuous between said first and second ends, and a continuous poly-gate, including a serpentine poly-gate active portion interposed between said source and drain diffusion regions, and covering said continuous serpentine channel between said first and second ends, wherein the continuous diffusion edges within said active region cascade a snap-back mode along said active portion of said poly-gate element, such that the entire said active portion of said poly-gate element turns on during an ESD event.

33. The output MOSFET of claim 32, wherein said output MOSFET being part of one of an output and Input/Output pin circuit.

34. A MOSFET structure for improving ESD protection, comprising:

an active region in a substrate, a channel formed in said substrate having first and second ends in the channel width direction and a serpentine shaped layout between said first and second ends, continuous drain and source diffusion regions within said active region, said drain and source diffusion regions being interdigitated, and being separated by said serpentine channel, such that an edge between said serpentine channel and said drain diffusion, and an edge between said serpentine channel and said source diffusion, are continuous between said first and second ends, and a continuous poly-gate having rounded corners in said active region to prevent an electric field crowding effect, including a serpentine poly-gate active portion interposed between said source and drain diffusion regions, and covering said continuous serpentine channel between said first and second ends, wherein a substantial portion of said poly-gate being connected in a single continuous serpentine form.

35. A MOSFEAT structure for improving ESD protection, comprising:

an active region in a substrate, a channel formed in said substrate having first and second ends in the channel width direction and comprising a U-shaped layout between said first and second ends, continuous drain and source diffusion regions within said active region, said drain and source diffusion regions being separated by said channel, such that an edge between said channel and said drain diffusion, and an edge between said channel and said source diffusion, are continuous between said first and second ends, and a continuous poly-gate having at least a rounded corner in said active region to prevent an electric field crowding effect, including a U-shaped ploy-gate active portion interposed between said source and drain diffusion regions, and covering said U-shaped layout of said channel, wherein a substantial portion of said poly-gate being connected in U-shaped form.

* * * * *